United States Patent [19]
Slocum et al.

[11] Patent Number: 5,733,024
[45] Date of Patent: Mar. 31, 1998

[54] MODULAR SYSTEM

[75] Inventors: Alexander H. Slocum, Concord, N.H.; Matthew J. Van Doren, Pleasanton, Calif.; Rodney Scott Ziegenhagen, II; Don Sauer, both of San Jose, Calif.

[73] Assignee: Silicon Valley Group, Inc., San Jose, Calif.

[21] Appl. No.: 527,797

[22] Filed: Sep. 13, 1995

[51] Int. Cl.$^6$ .............................. A47B 97/00; B65G 49/07
[52] U.S. Cl. .................................. 312/223.2; 312/223.6; 312/265.1; 312/111; 248/346.03; 414/940; 414/935; 206/711
[58] Field of Search .................. 206/711, 725; 414/217, 416, 935, 940; 312/223.2, 223.6, 257.1, 265.1, 265.2, 265.3, 111, 107, 352; 248/346.03, 316.8, 346.01

[56] References Cited

U.S. PATENT DOCUMENTS

| | | | |
|---|---|---|---|
| 2,350,075 | 5/1944 | Smith et al. | 248/346.03 X |
| 3,977,566 | 8/1976 | Hill et al. | 414/935 X |
| 5,009,385 | 4/1991 | Burgener et al. | 248/346.03 |
| 5,277,534 | 1/1994 | Anderson et al. | 312/107 X |
| 5,326,162 | 7/1994 | Boverman | 312/265.3 |
| 5,394,658 | 3/1995 | Schneiner et al. | 312/223.6 X |
| 5,407,449 | 4/1995 | Zinger | 414/935 X |
| 5,441,337 | 8/1995 | Mazura et al. | 312/257.1 X |
| 5,464,313 | 11/1995 | Ohsawa | 414/940 X |
| 5,476,176 | 12/1995 | Gregerson et al. | 206/711 |
| 5,503,472 | 4/1996 | Vu et al. | 312/223.2 |
| 5,527,390 | 6/1996 | Ono et al. | 414/940 X |
| 5,565,034 | 10/1996 | Nanbu et al. | 414/935 X |

FOREIGN PATENT DOCUMENTS

| | | | |
|---|---|---|---|
| 544311 | 6/1993 | European Pat. Off. | 414/940 |
| 8100965 | 4/1981 | Sweden | 312/223.6 |

OTHER PUBLICATIONS

Van Doren, Matthew J., Precision Machine Design for the Semiconductor Equipment Manufacturing Industry, Massachusetts Institute of Technology, May 1995.
Slocum, Alexander H., Precision Machine Design, Prentice Hall:Englewood Cliffs, New Jersey, p. 83, 352–353, 401–413, 1992.

Primary Examiner—Laurie K. Cranmer
Assistant Examiner—James O. Hansen
Attorney, Agent, or Firm—William B. Walker

[57] ABSTRACT

A modular system and a method of creating a modular system comprising a substantially rigid frame and a plurality of modules mounted at predetermined locations on the frame by means of kinematic couplings. The frame includes a main beam in the form of a spine, and a plurality of transversely extending bulkheads. The method includes creating a model of the system using rigid bodies and thereafter providing the frame and modules and securing them kinematically. The kinematic couplings comprise three pairs of aligning elements, each in the form of a male element and a contact element. The contact elements may take the form of grooves, tetrahedral depressions, or flat surfaces.

10 Claims, 12 Drawing Sheets

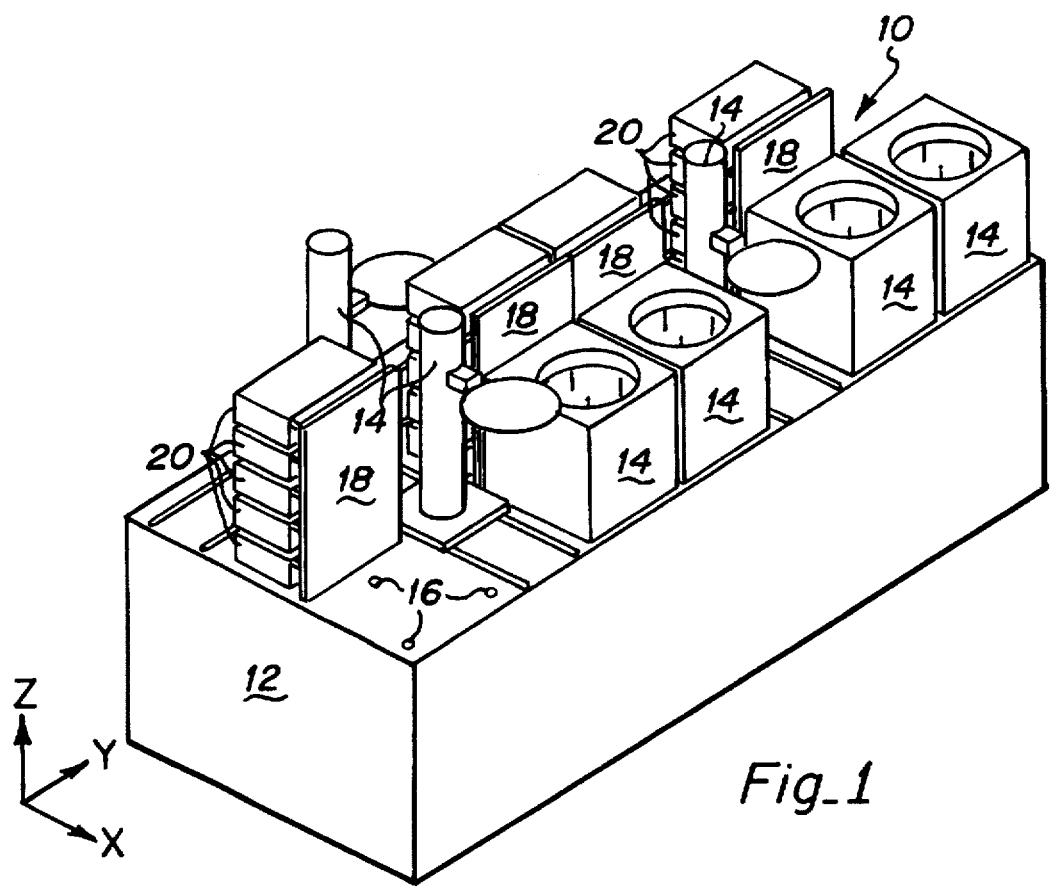
Fig_1
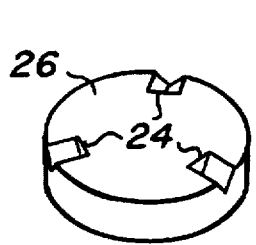
Fig_3
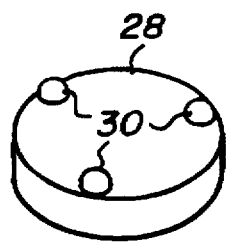
Fig_4
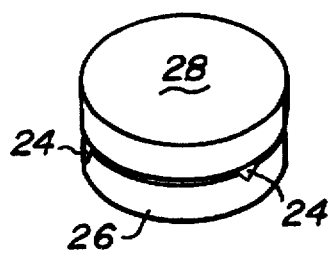
Fig_5

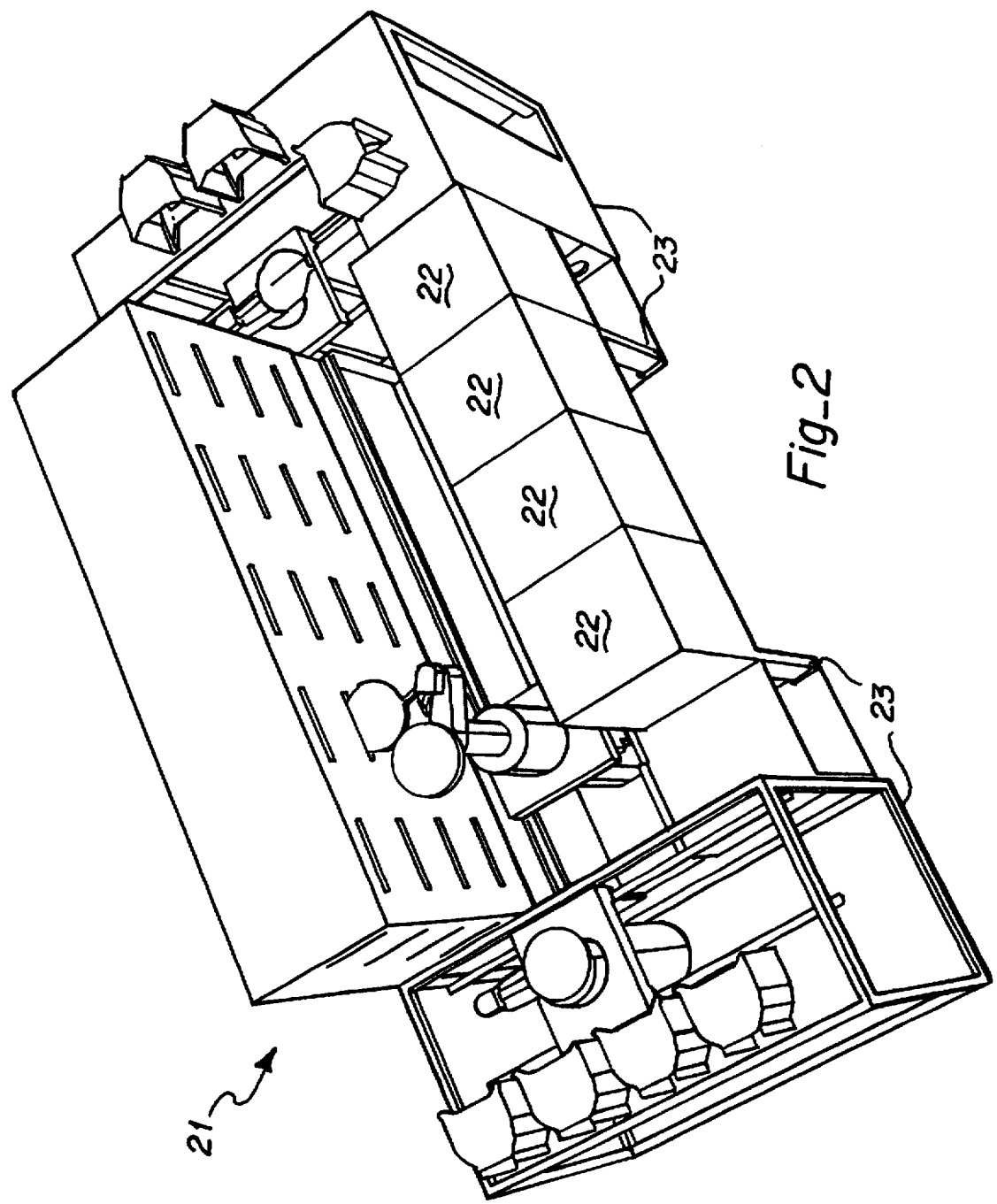
Fig_2

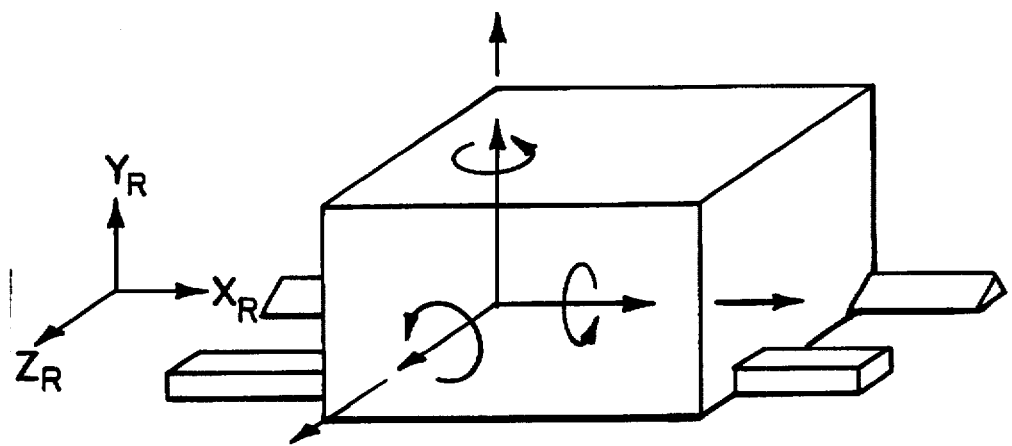
Fig_9
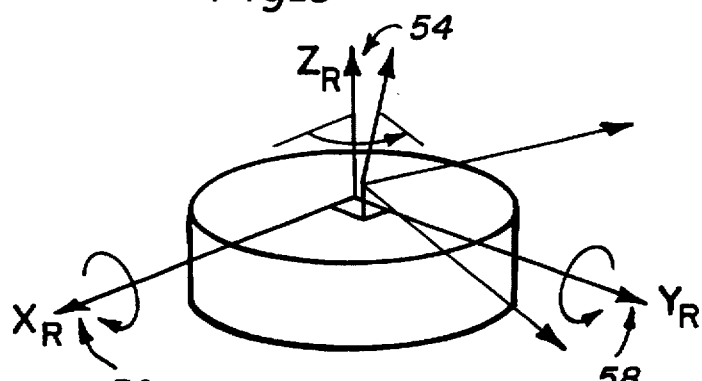
Fig_10
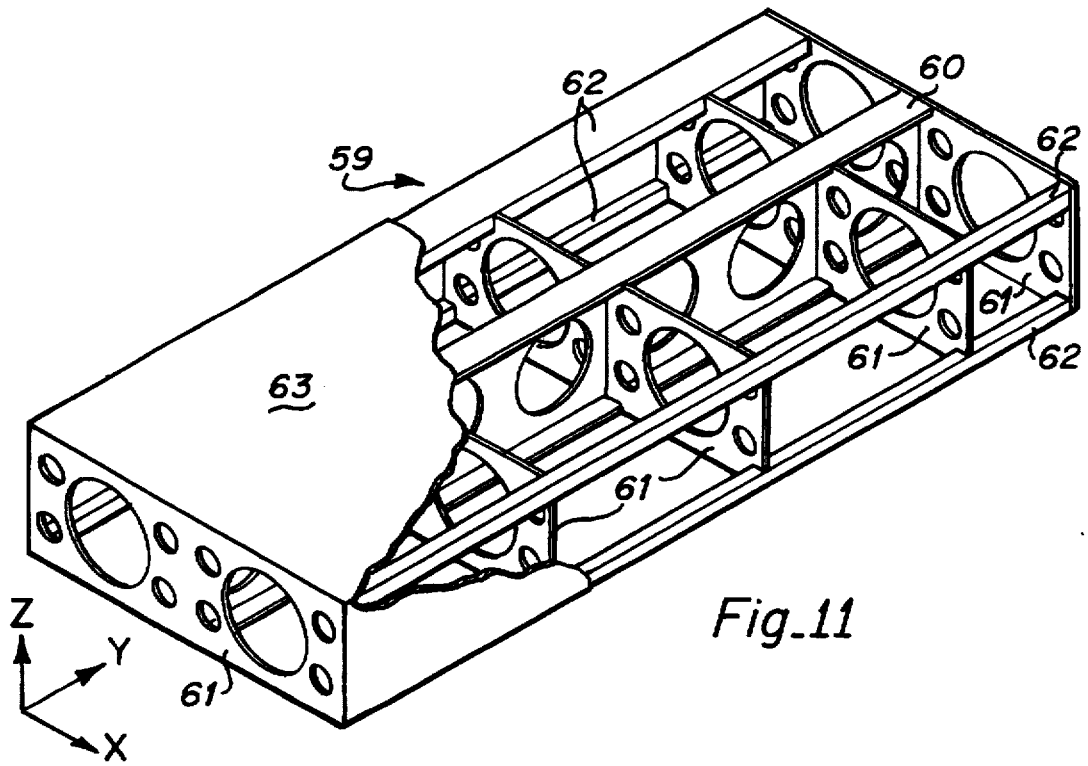
Fig_11

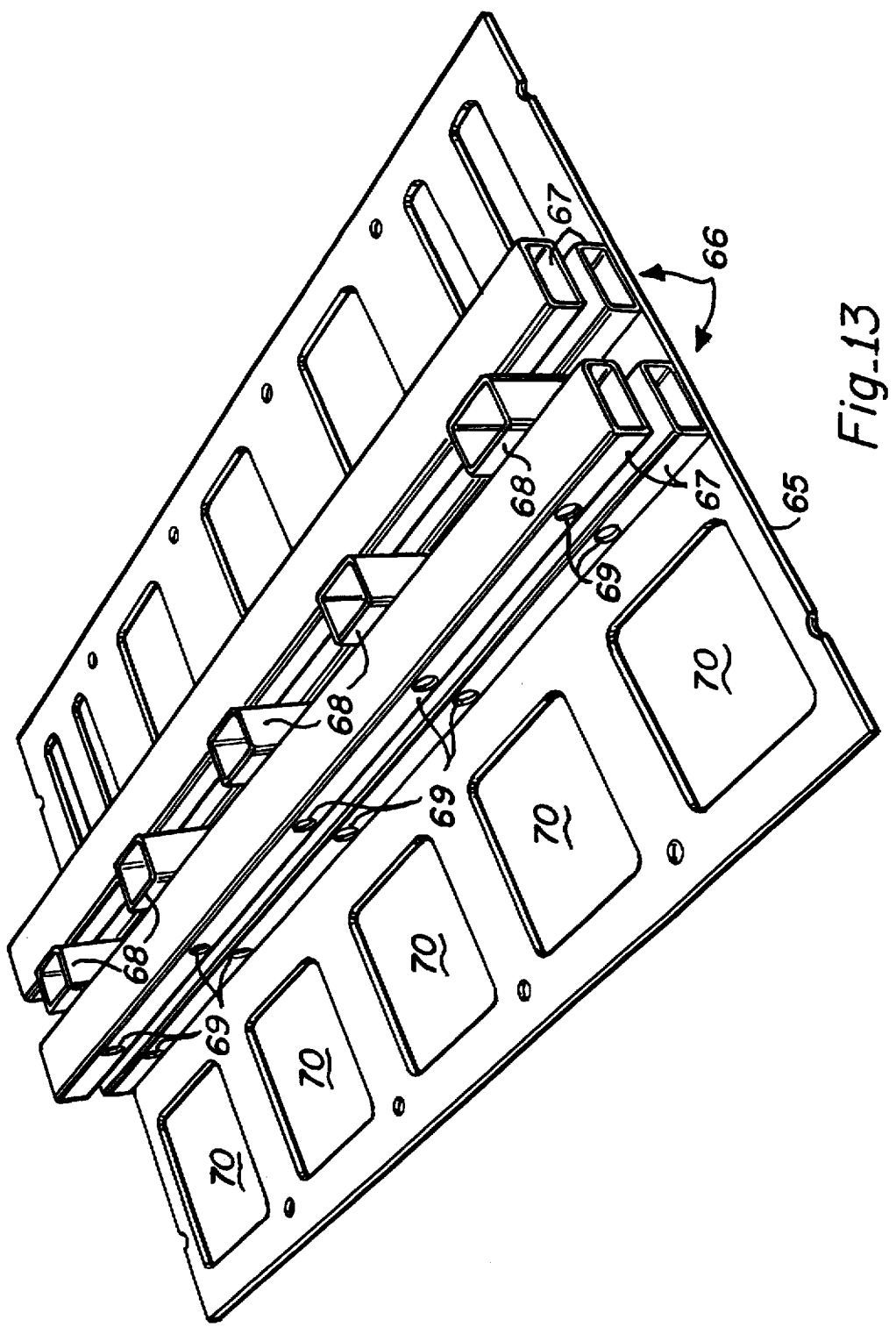
Fig_13

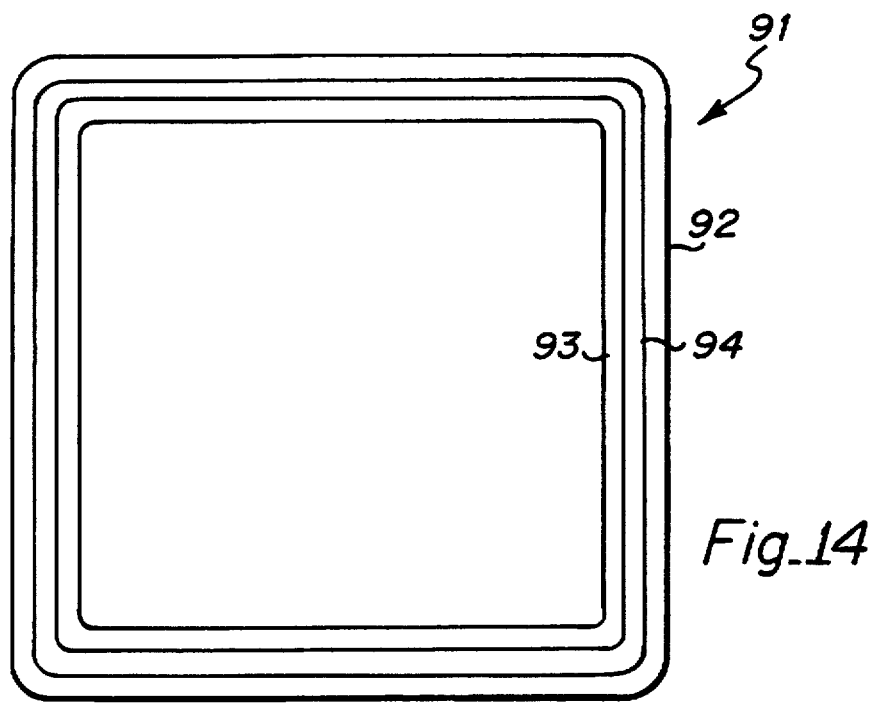
Fig._14
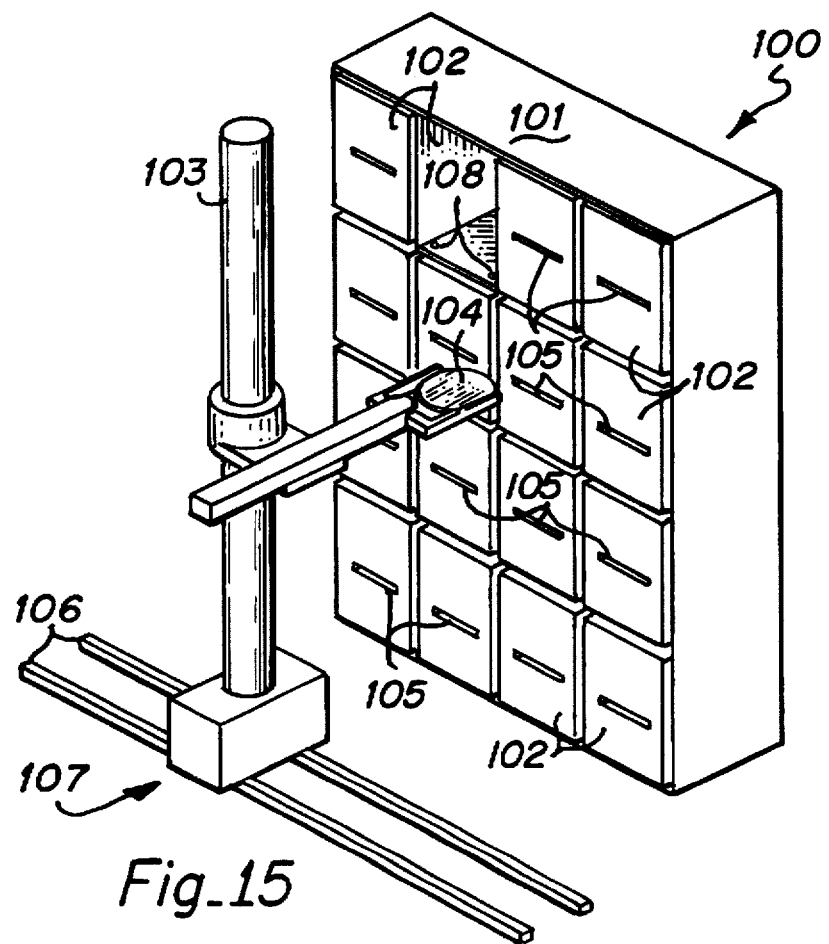
Fig._15

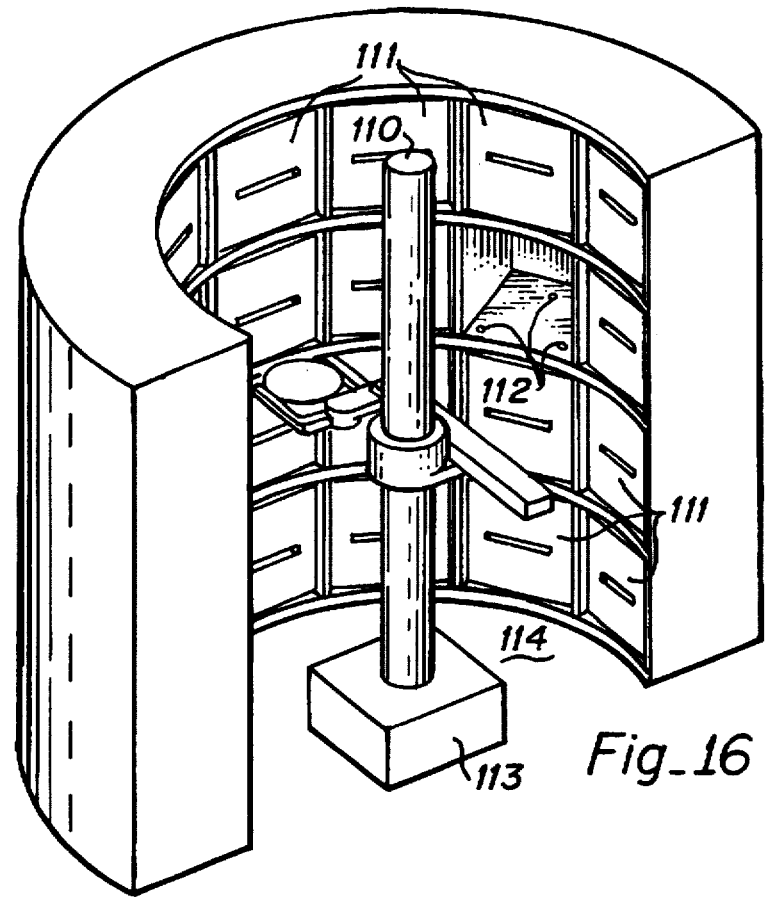
Fig_16
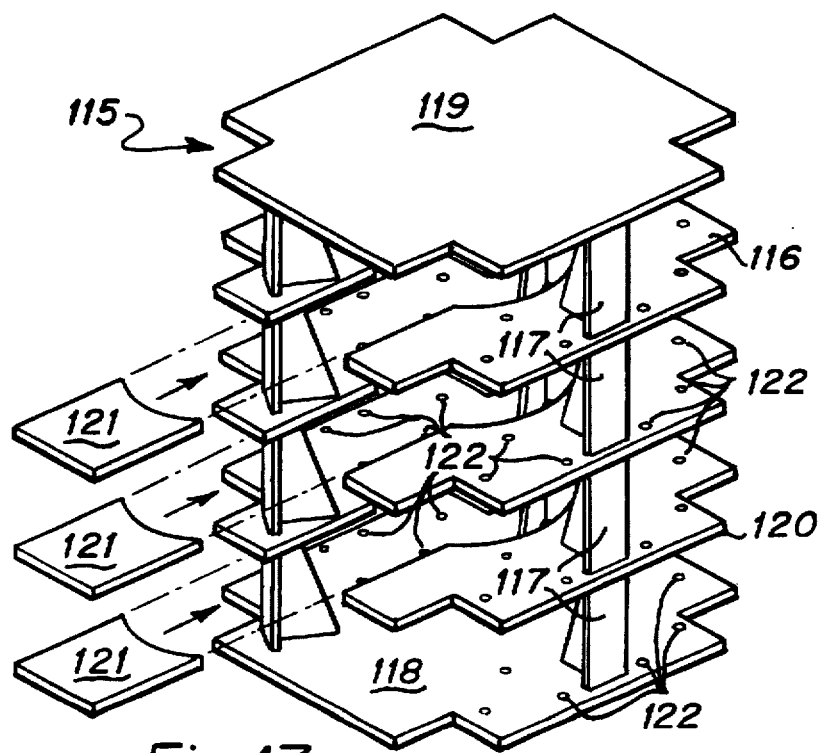
Fig_17

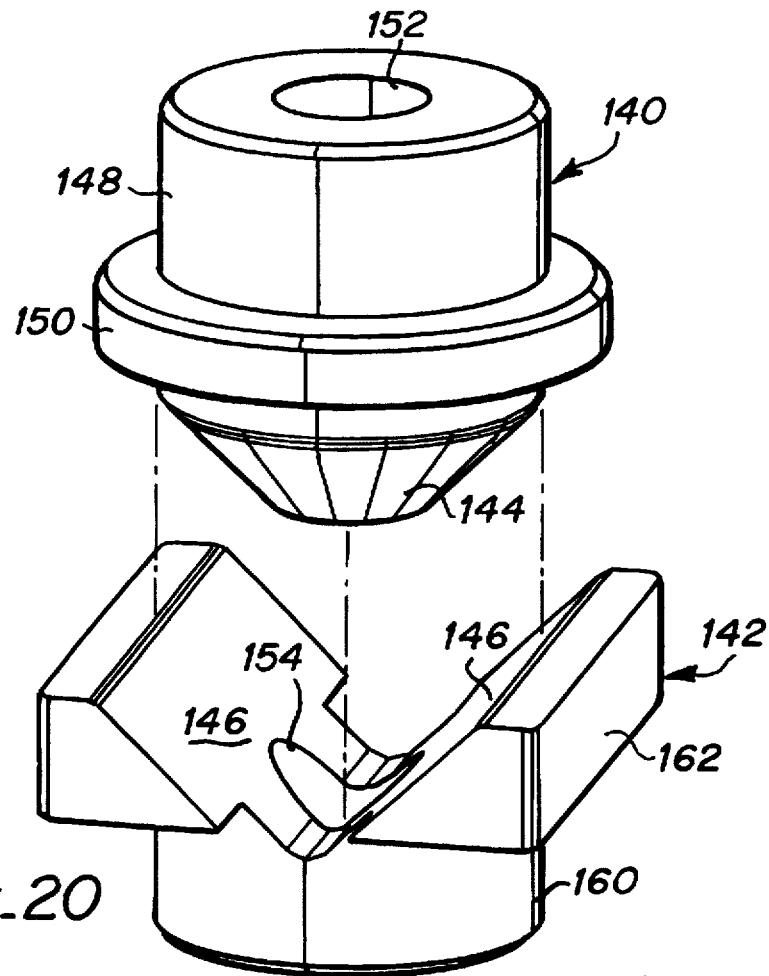
Fig. 20
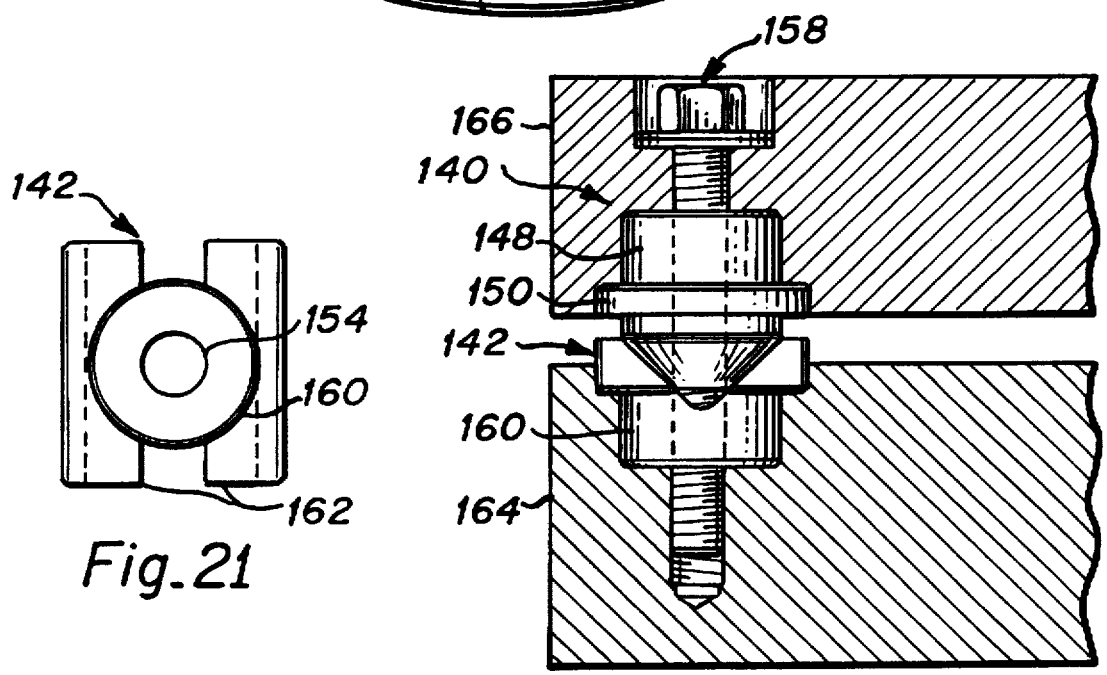
Fig. 21
Fig. 22

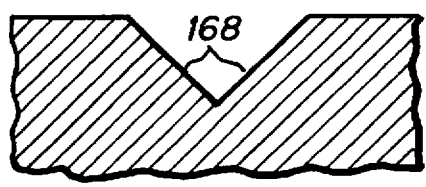
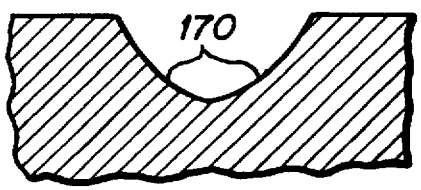
Fig._26   Fig._27
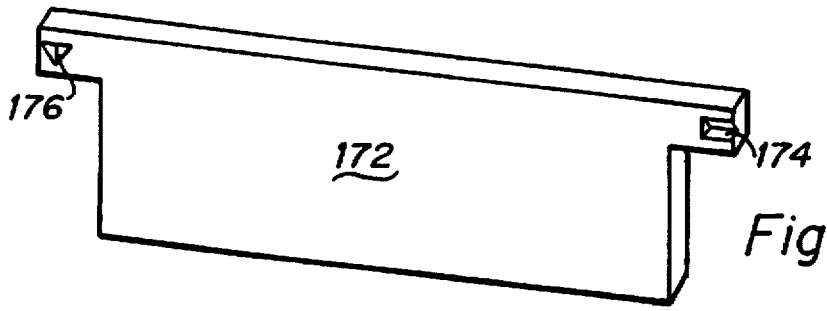
Fig._28
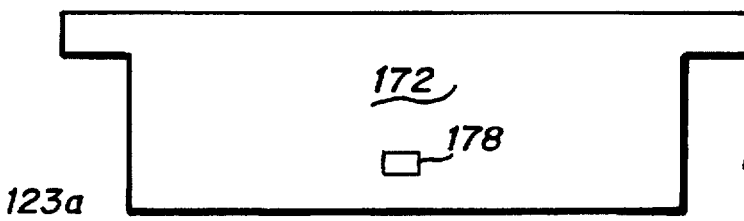
Fig._29
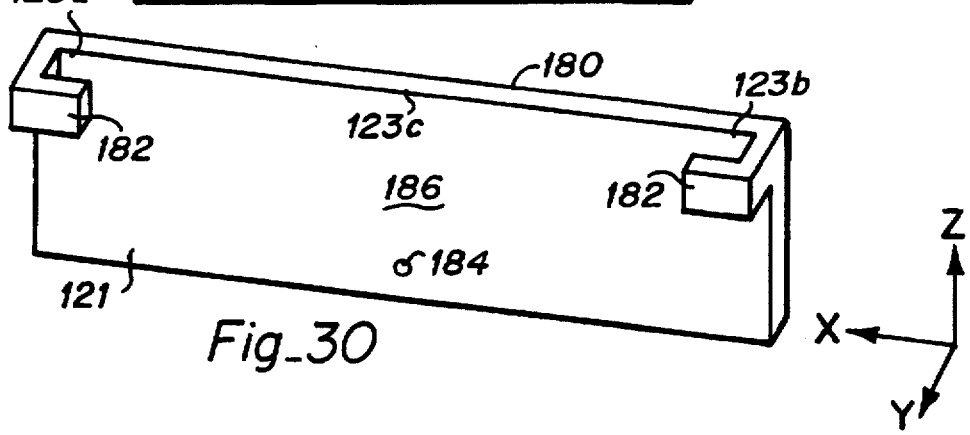
Fig._30
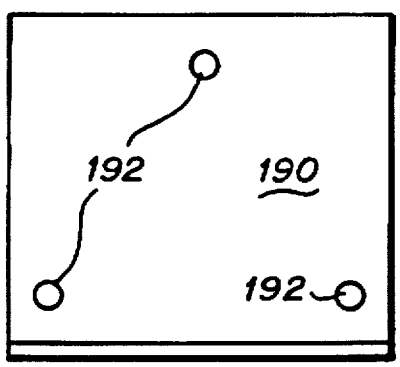
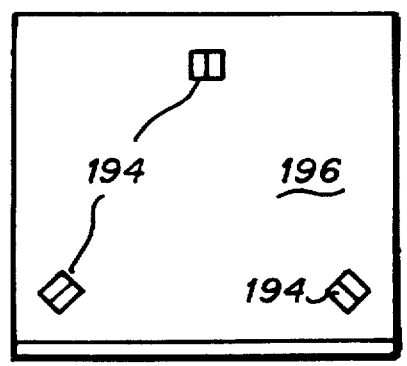
Fig._31   Fig._32

MODULAR SYSTEM

FIELD OF THE INVENTION

The present invention relates to a kinematic coupling, a modular system and a method of creating and maintaining a modular system.

BACKGROUND OF THE INVENTION

Many processing systems, such as a photoresist processing machine comprise a plurality of modules that are individually assembled and then attached to a frame to constitute the system. For example, a photoresist processing machine typically consists of modules attached to a frame made of thin steel tubing. Typically, the resulting structure is fairly flexible and requires adjustment of its many feet during assembly and later, in the field, during set-up. In many instances high accuracy is required in order to ensure that the handling robots are able to move components with a high degree of accuracy. Further problems are created by the fact that there is no dimensional reference between the modules and the frame. It is therefore difficult to spatially locate the various modules. In addition the modules are usually bolted to the frame, and require position adjustment means to properly align them. The prior art systems thus require careful initial adjustment to spatially orientate the material handling system and the modules relative to each other. Moving the machine from the factory to the plant where it will be used, requires careful re-adjustment of the modules, module support frames and material handling systems, and of the feet that support the frames in order to ensure that the frames have the exact same twisted shape they had at the plant at which they were first assembled. Should a module need servicing after the machine has been in use, the prior art systems require the careful recalibration of the module's position when replacing the modules.

OBJECTS AND SUMMARY OF THE INVENTION

It is an object of the present invention to provide a new and improved method for designing and assembling modular systems, wherein the modules are supported by a frame.

It is a further object of the invention to provide a rigid frame comprising: structural elements held together in a manner to transmit shear stresses so as to provide a high degree of stiffness, thereby allowing the machine to be mounted on three points.

It is yet another object of the invention to provide a kinematic coupling.

Furthermore, it is an object of the invention to use the rigid frame of the invention in conjunction with kinematic couplings in order to accurately place the modules relative to the frame and permit subsequent replacement of the modules without having to carefully realign the modules.

According to the invention there is provided a modular system comprising a substantially rigid frame; and a plurality of modules each of which is mounted at a predetermined location on the frame by means of a kinematic coupling between the frame and the module, the frame forming a common substrate for the modules thereby defining a global set of reference axes standing in a predetermined relationship to reference axes associated with each of the modules.

Each kinematic coupling can include three aligning element pairs comprising three male elements, and three contact elements opposing the male elements, the contact elements defining six contact surfaces to establish six points of contact between the male elements and the contact elements. Each kinematic coupling can further include securing means located in proximity to at least two of the aligning element pairs for securing the module to the frame, the securing means being located sufficiently closely to their respective aligning element pairs to continually maintain six points of contact between the three male elements and their contact elements. Each securing means can comprise a bolt extending between a male element and its contact element.

The contact elements can include orienting features and the frame or module on which each contact element is mounted, can include a reference feature for aligning the orienting feature relative to the reference feature. The orienting feature can comprise a spigot having a polygonal cross section, and the reference feature can comprise a complementary recess for the spigot.

The frame can comprise at least one main beam and a plurality of transversely extending bulkheads wherein the main beam can be an I-beam and the bulkheads extend under the regions where the modules are located. At least one main beam can comprise a tube containing at least one conduit. The outer tube can be separated by a tube means for conveying at least one of electricity and fluid. Holes may be defined in the bulkheads and a central web of the I-beam. At least one main beam can comprise a tubular structure, the tubular structure including an outer tube and at least one inner tube. The outer tube can be separated from the at least one inner tube by a damping medium.

At least one of the modules can comprise a support, fixedly secured to the frame, and a moveable member, movably connected to the support. The modular system can be a photoresist processing system for treating silicon wafers.

Further according to the invention, there is provided a method of creating a modular system having a frame and a plurality of modules secured to the frame in a predetermined spatial relationship, comprising: providing a substantially rigid frame and a plurality of substantially rigid modules; and securing the modules to the frame at predetermined locations on the frame using a kinematic coupling between the frame and each of the modules.

Still further according to the invention, there is provided a method of creating a modular system having a plurality of modules releasably secured to a frame and spaced from one another to facilitate predictable interaction between the modules, comprising: creating a homogeneous transform mathematical model of the system using rigid body analogies for the frame and the modules to determine suitable locations for the modules relative to a global set of reference axes associated with the frame, for desired interaction between the modules; providing a substantially rigid frame and substantially rigid modules; and securing the modules to the frame at the determined locations, the modules being secured to the frame by means of kinematic couplings.

Each kinematic coupling can include three pairs of aligning elements between the frame and the module, the method further comprising the step of securing a first element of each pair of elements to the frame, and securing the second element of each pair to the corresponding module.

A master plate may be provided for each kinematic coupling having a unique set of element locations, the plate depicting the locations of the first elements of the kinematic coupling, and serving to correctly position the second elements on the corresponding module.

Still further according to the invention there is provided a kinematic coupling for aligning and securing two components to each other, comprising: three pairs of aligning elements including three male elements and three contact elements opposing the male elements; and securing means located in proximity to at least two of the pairs of aligning elements for securing the male elements to their respective contact elements, the contact elements defining six contact surfaces to establishing six points of contact between the male elements and the contact elements, and the securing means being located sufficiently closely to their respective aligning element pairs to continually maintain six points of contact between the three male elements and their contact elements.

Each securing means can comprise a bolt extending through an aligning element pair. At least two of the male elements can have a round cross-section in a first plane and define convex surfaces in a plane perpendicular to the first plane. Each contact element can comprise a groove, preferably defining a pair of planer surfaces, each groove and its corresponding male element establishing two points of contact. Each contact element can comprise a groove defining a pair of planar surfaces. The three contact elements can, instead, comprise three different elements: a tetrahedral depression establishing three points of contact with a first male element; a V-shaped groove defining two points of contact with a second male element; and a flat surface to establish a single point of contact with a third male element, no securing means extending between the third male element and its contact element, and the third male element defining a convex abutment surface to establish the single point of contact with the third contact element.

BRIEF DESCRIPTION OF THE DRAWINGS

FIG. 1 is an isometric view of one type of wafer photoresist processing machine with the covers and support equipment removed;

FIG. 2 is an isometric view of another type of wafer photoresist processing machine;

FIG. 3 is an isometric view of three grooves forming part of a kinematic coupling;

FIG. 4 is an isometric view of three balls forming part of a kinematic coupling;

FIG. 5 is an isometric view of a three ball/groove kinematic coupling;

FIG. 9 is a schematic illustrating the error motions that can occur in a linear motion system;

FIG. 10 is a schematic representation illustrating the error motions that can occur in a rotary motion system;

FIG. 11 is a schematic isometric cutaway drawing of a rectilinear rigid frame in accordance with the invention;

FIG. 13 is an isometric view of the base plate and main beam structure of the frame of FIG. 12;

FIG. 14 is a sectional view through a tube of the frame shown in FIG. 12;

FIG. 15 is an isometric view of a wall-mounted bookshelf-type wafer photoresist processing system;

FIG. 16 is an isometric view of a semi-circular free-standing silo;

FIG. 17 is an isometric drawing of a silo-type structure comprised of stacked kinematically coupled layers;

FIG. 20 is an isometric view of one embodiment of a male element and a contact element constituting a pair of aligning elements used in the kinematic coupling of the invention;

FIG. 21 is a bottom view of the contact element illustrated in FIG. 20;

FIG. 22 is a sectional side view of the elements of FIG. 20, showing two base plates held together by means of a bolt passed through the pair of aligning elements;

FIG. 26 is a schematic representation of one embodiment of a contact element for use in a kinematic coupling;

FIG. 27 is a schematic representation of another embodiment of a contact element for use in a kinematic coupling;

FIG. 28 is an isometric view of a coupling plate showing two of the contact elements of a tetrahedron-groove-flat kinematic coupling;

FIG. 29 is an isometric view of the coupling plate of FIG. 28, showing the plate from the opposite side;

FIG. 30 is an isometric view of a support structure and the coupling plate of FIG. 28, with the coupling plate secured to the structure by means of the kinematic coupling;

FIG. 31 is a plan view of a master tooling plate for use in assembling a kinematic coupling; and FIG. 32 is a plan view of a set of contact elements positioned using the tooling plate of FIG. 31.

DETAILED DESCRIPTION OF THE INVENTION

Figure 6:
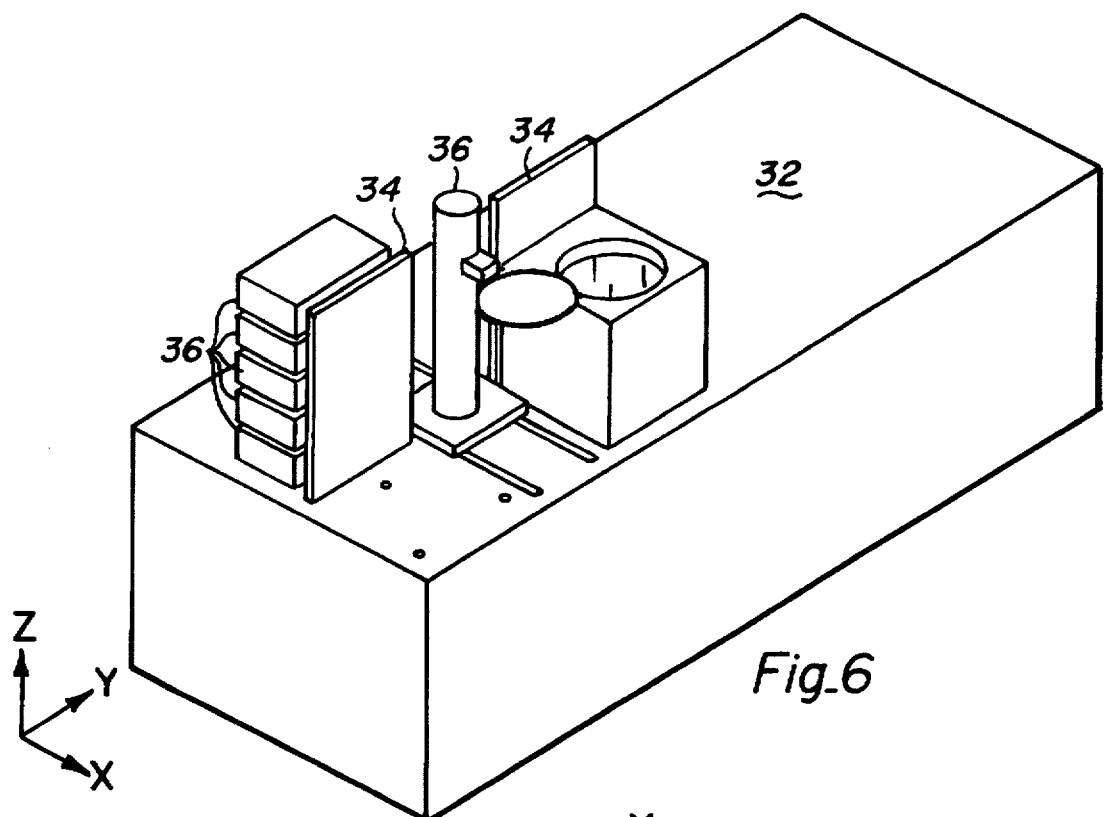
FIG. 6 is an isometric view of a homogeneous transformation matrix model of the system.

In a system comprising a plurality of modules. Since interaction takes place between the modules, it is essential that the modules be accurately located relative to each other. The present invention seeks to provide a uniform approach for designing, manufacturing, installing and servicing such a structure. For ease of description the invention will be described with reference to a photoresist processing machine consisting of several dozen modules including wafer handling robots, photoresist coaters, photoresist developers, hot plates, cold plates and interfaces to other equipment. Each of these modules' positions must be accurately known in order to assure the proper functioning of the system. Although the description deals with a photoresist processing system, the design, manufacturing, installation and servicing concepts discussed may be applied equally to other modular systems and are not to be considered as being in any way limited to a photoresist processing system.

The first step in manufacturing a modular system in accordance with the invention involves creating a model of the system using rigid body analogies for the various components. This allows the components to be spatially accurately placed relative to one another to achieve the desired interaction between the components. The model can be a physical model or a computer model. In a computer model a mathematical model of a machine is created based on the principle of error budgeting, which uses homogenous transformation matrices to model the system as a series of rigid bodies.

The next step involves manufacturing the system. In order for the model to be accurate the machine components must act like rigid bodies thereby closely emulating the mathematical models. In addition, a rigid framework has to be provided serving as a support structure for the modules.

Finally, the components are connected to each other using kinematic couplings. This allows the relative locations of the modules to be accurately maintained during manufacture, installation, and future servicing of the machine. This approach to design and implementation is discussed in greater detail below with reference to the drawings.

FIG. 1 shows a typical wafer photoresist processing machine with the covers and support equipment removed. The machine is indicated generally by reference numeral 10 and includes a main base support frame 12 to which are attached a plurality of modules 14. The modules 14 are secured to the base frame 12 by means of kinematic couplings 16. Each coupling 16 comprises three pairs of elements that engage each other so as to precisely locate a module 14 relative to the base frame 12. One element of each pair is secured to the base frame 12, while the other one of each pair of elements is secured to the module 14. As is discussed in greater detail below, subframes 18 are kinematically mounted on the base frame 12 and serve to support a plurality of modules 20.

Another embodiment of a wafer photoresist processing machine is shown in FIG. 2. In this embodiment the machine is indicated generally by reference numeral 21. The modules 22 are, again, kinematically secured to the frames 23.

FIGS. 3, 4, and 5 illustrate the concept of a kinematic coupling. FIG. 3 shows a set of three V-shaped grooves 24 formed in a plate 26. FIG. 4 shows a second plate 28 having three elements in the form of balls 30 protruding from a surface of the plate 28. Since the elements 30 need not necessarily be spherical balls, they will be referred to generally as male elements 30. When a male element is placed in abutment with a groove 24, it establishes two points of contact. Thus, the kinematic coupling as a whole establishes six points of contact for purposes of aligning the two plates. As will become clearer from the description below, the kinematic coupling is not limited to the use of grooves 24. It is merely necessary to establish six points of contact with the male elements. The three elements opposing the three male elements will hereafter be referred to as contact elements. The male elements 30 and grooves 24 are located at corresponding locations so as to engage with one another when the plates are placed on top of each other as illustrated in FIG. 5. In a kinematic coupling, as described here, any misalignment between the plates 26, 28 will automatically be adjusted. Considering FIGS. 3 and 5, the bevelled sides of the V-shaped grooves 24 insure that the convex surfaces of the male elements 30 always center themselves in the grooves. Also, since the grooves are directed outwardly, they interact with the male elements 30 avoiding any lateral displacement between the plates 26, 28.

By providing one of each of the pairs of elements on a module and the other one of the pairs of elements on a support frame it is possible to construct a modular system in which modules are easily replaceable; the modules automatically align themselves thereby avoiding complicated recalibration.

Figure 7:
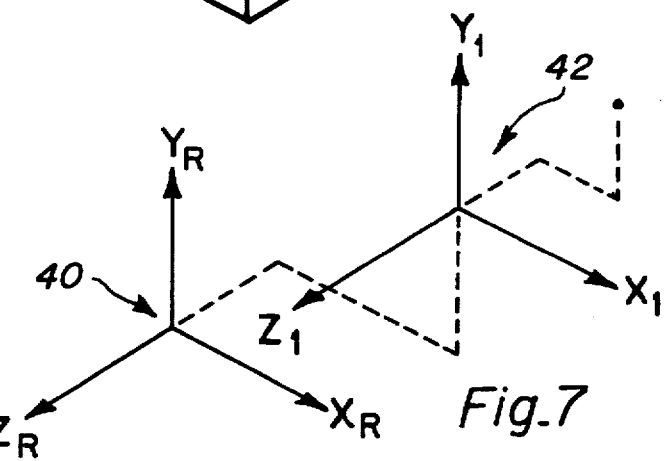
FIG. 7 is a diagram representing two coordinate systems and their relative locations with respect to each other for the purposes of illustrating the first step in the construction of a homogeneous transformation matrix (HTM) model of a precision system.
Figure 8:
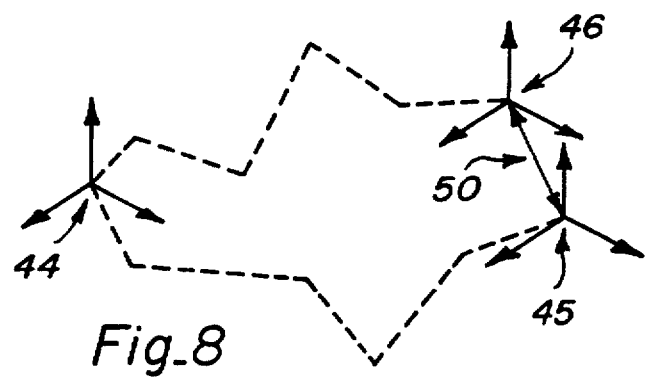
FIG. 8 is a diagram illustrating how a series of coordinate systems linked represented by HTMs can be used to model the errors in a system between the tool and the work piece (e.g., wafer and process module)

The kinematic coupling described above forms the basis of the system and of the method to be described below. FIG. 6 represents the design phase during which the system is accurately mathematically modeled. A homogenous transformation matrix model of the system allows its accuracy to be determined before the system is built. Thus modifications can be made before proceeding to the machining stage. The frame 32, subframes 34, and modules 36 are provided with their own reference coordinate system to define their respective locations. Each frame, subframe and module is also provided with its own homogenous transformation matrix model used to allow local coordinate systems to define the position of an element in a reference system and then to relate that coordinate set back to a global set of coordinates. Two coordinate systems defining the relative positions of two rigid body elements in the system are illustrated in FIG. 7. The reference coordinate system 40 serves as a global coordinate system for the coordinate system 42. The transformation matrix for coordinate system 42 serves to relate the rigid body element at the coordinate system 42 in three dimensions, to the coordinate system 40. In a typical machine where there are moving components, the homogenous transformation matrix models relate the positional data relative to a local coordinate system to the global coordinates. The position of the element relative to the global coordinates is then determined and transformed back to the local coordinates. The mathematical model works on the basis of having only rigid elements. The components used to implement the system therefore have to be substantially rigid to avoid errors between the mathematical model and the actual physical structure. This is illustrated in FIG. 8 in which the global coordinate system is indicated by reference 44. The error between where the tool 46 is located and the position where the work piece 48 is to be located is indicated by reference 50. In order to minimize these errors, the present invention proposes the use of rigid frames to closely follow the simulated mathematical model. In addition, kinematic couplings are used to accurately place the modules relative to the frame.

As illustrated in FIG. 9, a linear motion system has 6 degrees of freedom, one of which is the intended range of motion, and the other five are error motions. For example, intended motion along the X-axis may result in linear motion errors along the Y-axis and Z-axis, and rotational errors in the form of pitch, roll and yaw. Angular motions are amplified by linear lengths to create linear errors that increase in magnitude the further one moves from the source. These amplified angular error motions are also referred to as Abbe errors. For rotary motion axes, as illustrated in FIG. 10, there is an intended rotation about the axis of rotation 54, and five small errors along and about the axes 54, 56, and 58. The mathematics involved in the homogenous transformation are discussed in the textbook *Precision Machine Design* by Alexander H. Slocum (©1992 by Prentice-Hall, Inc.).

As mentioned above, one of the key features of the invention is the provision of a rigid frame. This is illustrated in greater detail in FIGS. 11 to 13. Every rigid body has 6 degrees of freedom consisting of three translational and three rotational motions. In order to uniquely define the position of a body in space, 6 degrees of freedom must be constrained. Thus a minimum of six contact points must be established. Mathematically, if six contact points are established, equations can be written to easily predict the rigid body behavior of the system. Using space-frame methodologies, cubic processing modules can be designed. This allows the process module to be exactly located with respect to the frame. In the embodiment illustrated in FIG. 11, the frame 59 is composed of a skeleton defined by an I-beam 60 and a series of bulkheads in the form of plates 61 arranged perpendicularly to the I-beam 60. The plates 61 constitute structural support webs extending between the I-beam 60 and longitudinally extending braces 62. Weight reduction holes are provided in the central web of the beam 60 and plates 61 to provide a light weight structure having the requisite rigidity. An outer skin 63, in the form of metal plates, covers the skeleton. The metal plates 68 support the kinematic elements, as is described in greater detail below.

Figure 12:
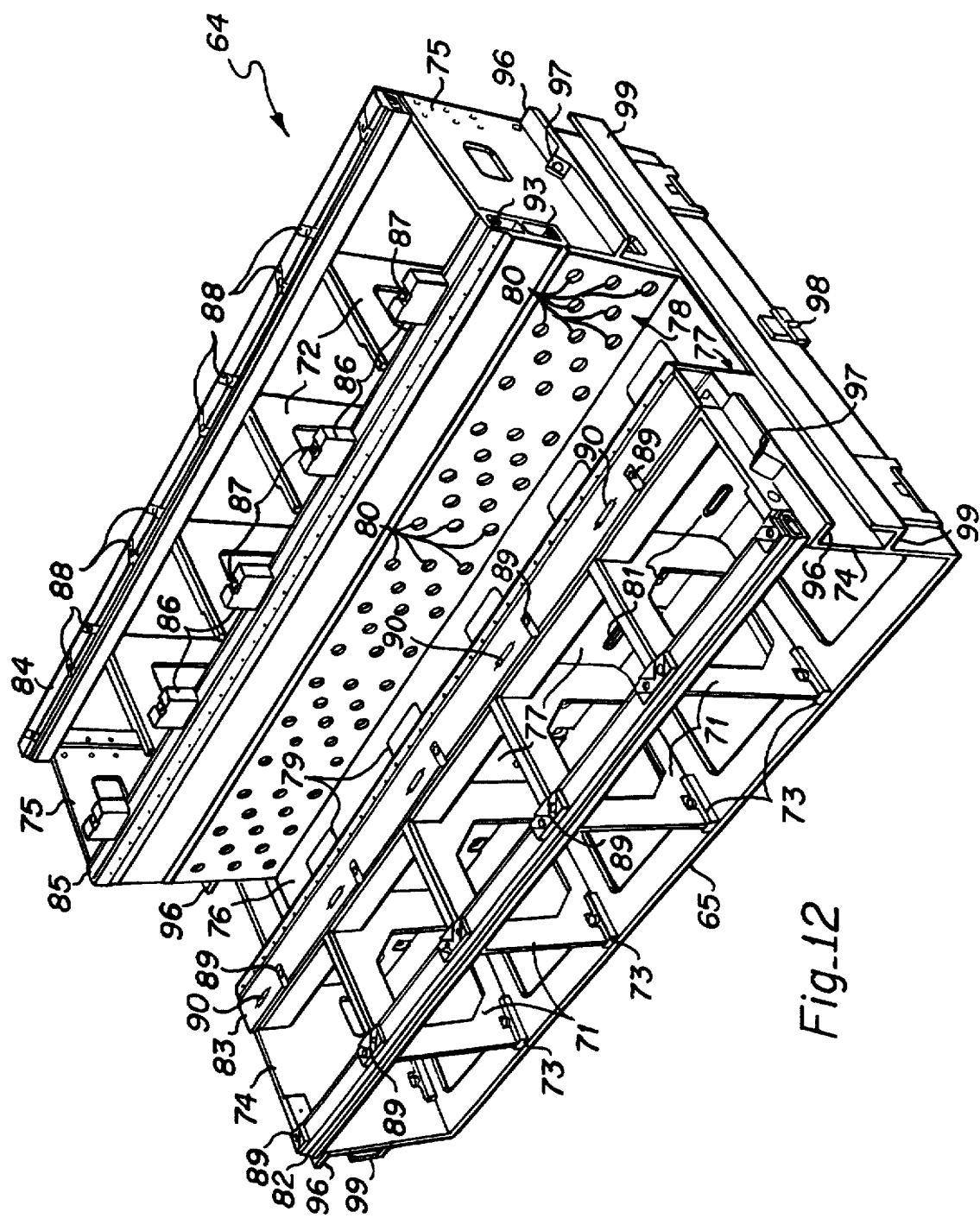
FIG. 12 is a schematic isometric view of another embodiment of a rectilinear rigid frame in accordance with the invention.

FIG. 12 illustrates another embodiment of a rectilinear rigid frame in accordance with the invention, indicated generally by reference numeral 64. It includes a metal base plate 65 and a central longitudinally extending beam structure 66 (FIG. 13), defining a spine. The beam structure 66 comprises a set of four longitudinally extending metal tubes 67 secured to spaced-apart vertically extending support post 68. In this embodiment, the tubes 67 are welded to the posts 68. The tubes of each pair of tubes on either side of the posts 68 are spaced vertically from each other. The vertically extending support posts 68 protrude above the level of the tubes 67 to engage complimentary holes in a floor plate of the frame 64, as is discussed in greater detail below. A plurality of holes 69 are formed in the tubes 67. The holes 69 provide exhaust channels for chemical vapors, and are in flow communication with the channels defined by the posts 68. Conduits (not shown) extend between the tubes 67, interconnecting the holes 69. Weight-reducing holes 70 are formed in the base plate 65, the base plate 65 and beam structure 66 forming a rigid, relatively light support structure for the rest of the frame 64.

As shown in FIG. 12, structural support webs 71, 72 extend vertically from the base plate 65 and are welded to the plate 65. Castor supports 73 are secured to the upper surface of the base plate 65 and include threaded holes that extend through the base plate 65 for receiving threaded shafts of castors (not shown). The ends of the frame 64 are defined by vertically extending plates 74, 75. An inner longitudinally extending channel is defined by a horizontal floor plate 76 and two parallel, vertically-extending side plates 77, 78. The floor plate 76 includes a plurality of holes 79 that receive the upper ends of the posts 68. This provides air flow communication with the interior of the frame 64, to exhaust chemical vapors produced during chip manufacture. The plate 78, in turn, includes a plurality of round holes 80 to provide air flow communication, also for purposes of exhausting chemicals. The plate 77 has a plurality of substantially rectangular holes 81 formed in it to form a path for electrical wiring, and tubing, thereby to provide communication between the portions of the frame on either side of the longitudinally extending channel. In order to provide greater support, and to maintain the structural integrity of the frame 64, longitudinally extending beams 82, 83 are connected to the upper ends of the support webs 71 and end plates 74. Similarly, longitudinally extending beams 84, 85 are secured to the upper ends of the webs 72 and end plates 75. Support blocks 86, mounted on the beam 85, support a kinematic coupling element 87, each such kinematic coupling element 87 being associated with two further kinematic coupling elements 88. This defines a set of kinematic coupling elements for use in conjunction with a complimentary set of elements (not shown). The support blocks 86 also serve to space the modules from the beam 85. This allows access to be gained to the interior of the frame 64, in order to maintain the electrical cabling, and the tubing for the chemicals and vapors. Like the beams 84, 85, the beams 82, 83 also support kinematic coupling elements 89, to support complimentary elements (not shown).

The beams 83 and 85 also house electrical conduits for connection to the various modules to be attached to the frame 65. Power lines extending along the beams 83, 85 are electrically connected to electrical connectors mounted at each module site 90 along the beam 83. Furthermore, in order to reduce vibration, caused by moving machinery, the beams 82, 83, 84, and 85 are provided with damping. A general depiction of one of the beams 82, 83, 84, and 85 is shown in FIG. 14 and indicated by reference numeral 91. The beam 91 comprises a tubular structure, including an outer tube 92 having an epoxy lining, and an inner tube 93 separated from the outer tube 92 by an elastic damping medium 94. The two tubes 92, 93 and medium 94 provide the necessary damping. It will be appreciated that the tubes 67 and the tubes 82, 83, 84, and 85 can support a variety of conduits for electrical supply and fluid supply and exhaust. Fluids can be conveyed within conduits or directly within the tubes 67, 82, 83, 84, or 85. While FIG. 14 shows only one inner tube 93, the beams 82, 83, 84, and 85 can include more than one inner tube. Beam 85, illustrated in FIG. 12, for instance, includes two inner tubes 93.

The housing 64 is kinematically connected to end frames (not shown) by means of kinematic couplings shown in FIG. 12. Two of the kinematic coupling elements of each kinematic coupling are supported on end brackets 96 and are indicated by reference numeral 97. The third coupling element 98 is secured to the end plate 74 and faces outwardly. L-shaped brackets 99 also extend from the ends of the frame 64 and are located below the brackets 96. The brackets 99 provide torsional rigidity to the frame 64 and serve as rails for guiding the end frames into place.

In the system illustrated in FIG. 1, sub-frames are included that support their own set of modules. Such a sub-frame and modules is provided in FIG. 15 in which a wall-mounted bookshelf-type of wafer photoresist processing system 100 is illustrated, comprising a rack 101 and wafer housings 102. The bookshelf-type wafer photoresist processing system 100 has to be accurately mounted relative to a robot 103 to insure accurate placement of wafers 104 in the respective slots 105. To achieve this the robot is mounted on rails 106 secured to a main base frame 107. The sub-frame takes the form of a vertically extending plate (not shown) which defines the "wall" for the system 100. The sub-frame is secured to the main frame 107 by means of kinematic couplings (not shown). The rack 101 is, in turn, secured to the sub-frame by means of a kinematic coupling, and the housings 102 are individually secured to the sub-frame by means of kinematic couplings 108.

FIG. 16 shows a semi-circular free-standing silo 109 for a wafer photoresist processing machine that partially encircles a polar coordinate robot 110. The semi-circular shape shields personnel from motions of the robot 88. In this configuration the silo 109 has a semi-circular configuration and serves as a sub-frame for modules 111. Again, kinematic couplings are used to mount the modules 111. FIG. 16 illustrates the male elements 112 of a kinematic coupling. The corresponding contact elements, in the form of grooves, for the kinematic coupling are located on the lower surface of the corresponding module. Similarly, the base 113 of the robot 110, and the silo 109 are secured to the main frame 114 by means of kinematic couplings. As is discussed in greater detail below, the aligning element pairs constituted by the male and contact elements are permanently mounted by press fitting the elements into holes that are precision bored into the structure.

Yet another vertical design is the silo 115 illustrated in FIG. 17. It includes a series of layers or plates 116 which are spaced from each other by means of vertical support struts 117. The lower plate 118 and upper plate 119 are unitary structures secured to the struts 117. In contrast, the intermediate plates 120 have removable sections 121 that provide access to the interior of the structure. The various layers 116 are provided with kinematic elements such as male elements, e.g. balls; or contact elements, e.g. grooves 122, for aligning and securing process modules to the frame of the silo 115. The plates 116 have square cut-outs at their corner for receiving exhaust ducts (not shown).

Figure 18:
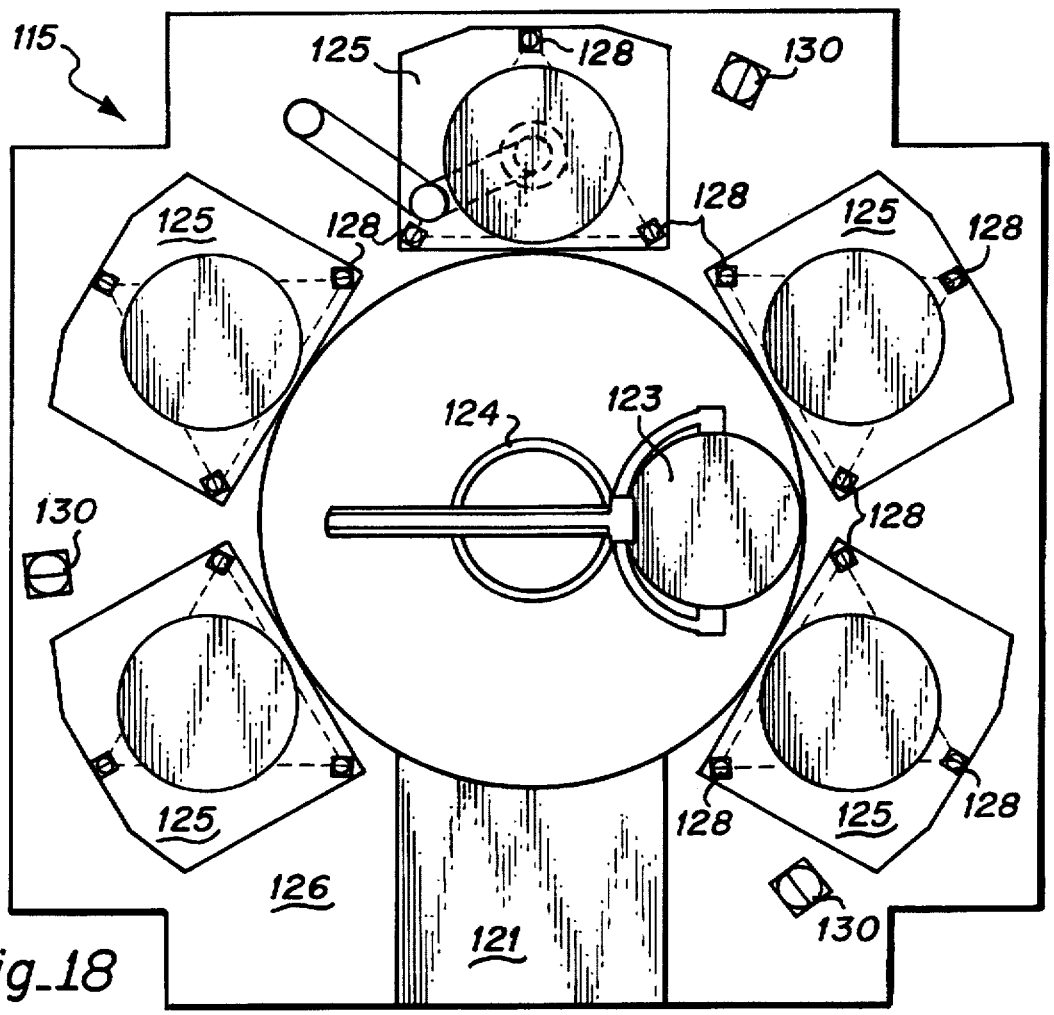
FIG. 18 is a plan view of one of the layers of the silo of FIG. 17.

FIG. 18 is a plan view of one of the layers of the silo illustrated in FIG. 16. The wafer 123 is moved within the silo 115 by means of a polar coordinate robot 124. Process modules 125 are kinematically coupled to the plate 126 by means of kinematic couplings 128. The plate 126 is, in turn, kinematically coupled to adjacent plates by means of kinematic couplings 130 between the plate and support struts 117 (FIG. 17). The removable sections 121 are clearly illustrated in FIG. 18.

Figure 19:
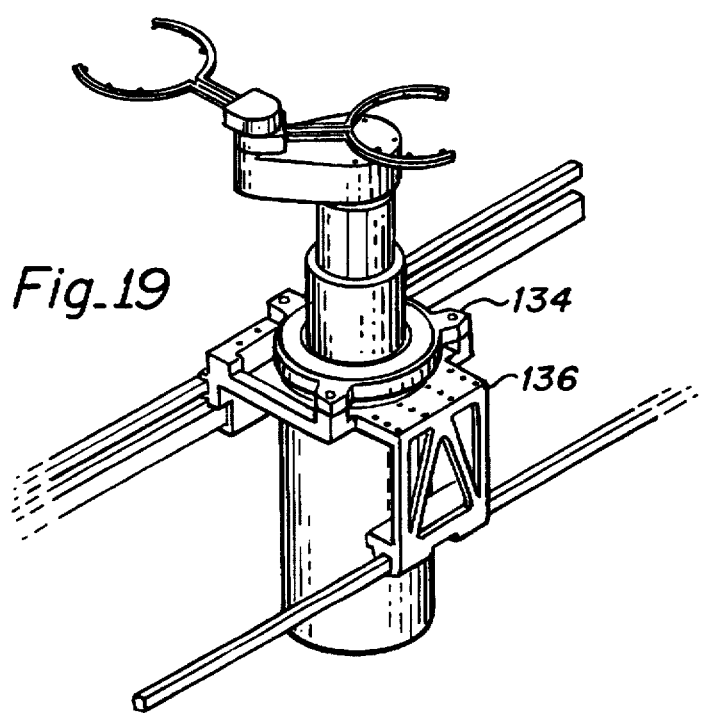
FIG. 19 is an isometric view of a wafer handling robot and a horizontal carriage, showing a three point kinematic coupling between the robot and carriage.

FIG. 19 illustrates another application of a kinematic coupling, which is provided between a robot support bracket 134 and a horizontal carriage 136. Once again it permits easy removal and replacement of robots for servicing.

Figure 23:
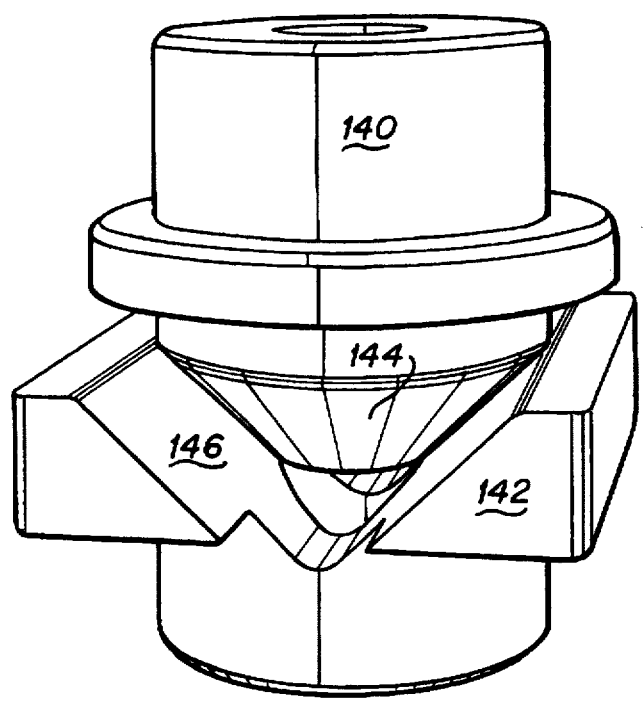
FIG. 23 is an isometric view of the pair of aligning elements of FIG. 20, showing the elements in abutting relationship.
Figure 24:
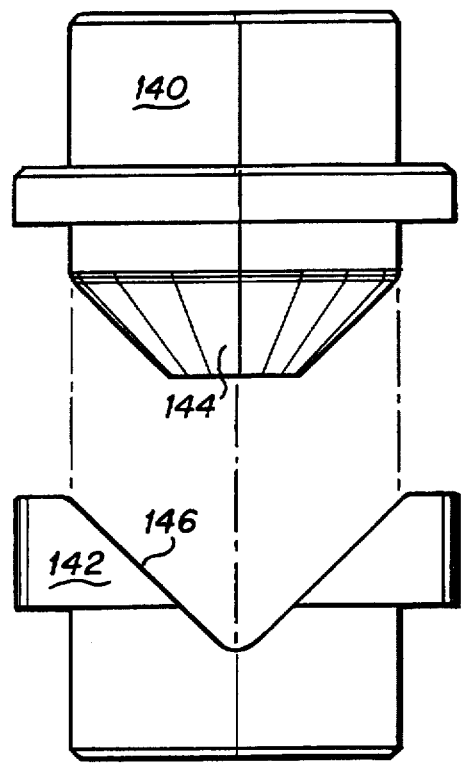
FIG. 24 is a side view of the male and contact elements of FIG. 20.
Figure 25:
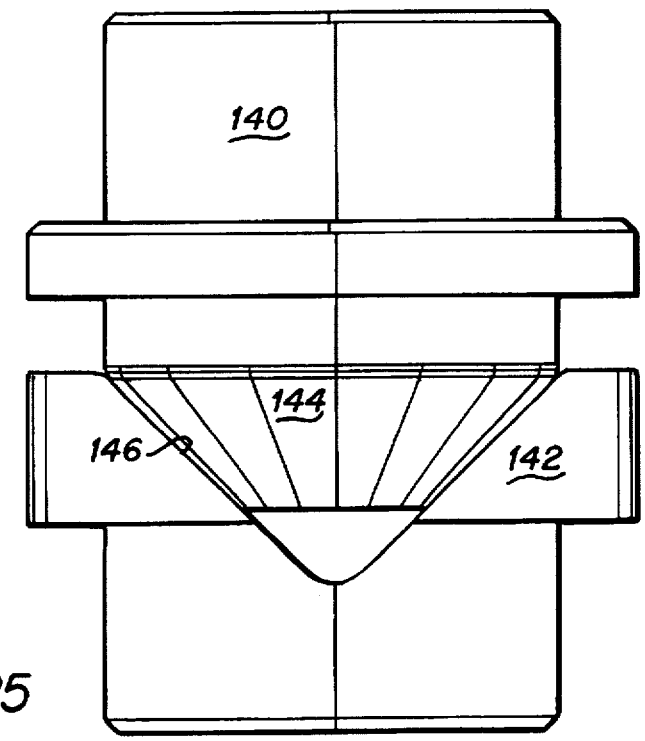
FIG. 25 is a side view of the elements of FIG. 20, showing the elements in abutting relationship.

The kinematic couplings may take a variety of forms. A preferred embodiment will now be discussed in greater detail with reference to FIGS. 20 to 22. FIG. 20 shows the male element 140 and contact element 142. The elements 140, 142 have abutting surfaces 144 and 146, respectively. The male element 140 has a cylindrical section 148 and a radially outwardly extending flange 150 which are received in complimentary recesses in the structure to which the element 140 is secured, as illustrated in FIG. 22. The surface 144 has a substantially frusto-conical shape. However, the bevelled surfaces 144 are not entirely straight, but are convex when viewed from the side. The V-shaped groove of the contact element 142, on the other hand, has planar surfaces 146 which abut the curved surface 144. An axially extending bore 152 passes through the male element 140. Similarly, an axially extending bore 154 passes through the contact element 142 as illustrated in the bottom view of FIG. 21. The elements 140, 142 can thus be connected to each other by means of a bolt 158 passed through the aligned bores 152, 154 as illustrated in FIG. 22. In this embodiment, the elements therefore perform not only an aligning function but also a connecting function for securing two components to each other. It is desirable to include connectors, such as the bolts 158, in sufficiently close proximity to the aligning elements so as to ensure that the six points of contact between the male elements and the contact elements are continually maintained. Preferably a connector extends between each male element and its contact element. Since the male element and contact element pairs represent the points of support for the components, stresses on the components are minimized if the bolts pass through the aligning element pairs themselves or are in close proximity to the aligning element pairs. The contact element 142 includes a cylindrical section 160, the upper part of the element 142 defining a flange 162. The cylindrical section 160 and part of the flange 162 are received in a complimentary recess in a base plate 164 (FIG. 22). The flange 162 is received in a complimentary recess, the flange defining a spigot. It thus serves as an orienting feature which ensures correct angular alignment of the contact element 142. The complimentary recess in the plate 164 thus serves as a reference feature for the orienting feature 162. Clearly, other features, for example marks on the contact element and plate 164, could be used as orienting and reference features. The plate 164 is illustrated as being the lower plate, and the plate 166, which supports the male element 140 as being the upper plate. Clearly the male element could equally well be secured to the lower plate while the contact element is secured to the upper plate. The upper and lower plates typically form part of a module or frame. It will be appreciated that the support structure for the male and contact elements need not necessarily take the form of a plate. Clearly, since the surface 144 has a convex shape, the surfaces 144 and 146 do not abut along their entire lengths. The male and female elements effectively form a ball and socket arrangement in which the socket has planar sides. The radius chosen for the curved surface 144 depends on the load to be carried by the kinematic coupling. The larger the load, the greater the radius to be used for the convex surface thereby to provide a larger support surface abutting the surfaces 146 of the contact element. The elements 140, 142 are shown in abutting relationship in FIG. 23 and from the side in FIGS. 24 and 2. The abutting surfaces 144, 146 perform a self-aligning function. In FIG. 24 the male element 140 is located above the contact element 142. As they are placed into abutting relationship, any misalignment between the axes in the X-direction is adjusted by the slanted surfaces to achieve exact coincidence of the axes along the X-axis. By using a set of three pairs of elements, alignment is also achieved along the Z-axis. Since the Z-axes of the three pairs of elements are at angles to each other, the sub-frame or module supported by the three pairs of elements will be centralized on the elements. Thus, each pair of elements will be aligned along its X- and Z-axis when in abutting relationship, as illustrated in FIG. 25.

In the embodiment described above the groove of the contact element 142 had planar surfaces while the male element had a convex surface. The groove is represented schematically in FIG. 26 by reference numeral 168 and is a preferred embodiment due to the ease with which it can be machined. It will be appreciated that the convex surface 144 of the male element (FIG. 23.) could simply be a ball, sized to be received in the groove 146. However due to the small radius of curvature of such a ball and the corresponding small contact surface, this would create excessively high stresses in most cases. To avoid this, the radius of curvature of the surface 144 is increased. Instead, the groove could be formed to have concave surfaces as illustrated in FIG. 27. The groove 170 of FIG. 27 is a Gothic arch groove, the sides of which have radii of curvature that are closer to that of the mating ball, thereby to reduce stresses and provide a stiffer coupling. Hertz theory could be used to describe the stress states. The design of kinematic couplings is discussed in greater detail in the textbook *Precision Machine Design* by Alexander H. Slocum (©1992 by Prentice-Hall, Inc.).

The kinematic couplings discussed above are best suited to applications where the modules are mounted on a horizontal main support frame. Many connections however require a vertical assembly in which a vertical frame supports a plurality of modules as described with respect to the silos considered above. FIGS. 28 to 30 illustrate the concept of a tetrahedron-groove-flat kinematic coupling used when the coupling aspect ratio is very low, which allows lowheight modules to be accurately located with respect to a vertical frame. FIGS. 28 and 29 illustrate a coupling plate 172 that is attached to the back of a module such as a module 20 (FIG. 1). The plate 172 is provided with two depressions. A V-shaped groove 174 and a tetrahedral depression 176 are located on one side of the coupling plate 172 (FIG. 28). A flat surface, indicated by reference numeral 178 (FIG. 29) is defined on the opposite side of the plate 172. The vertical frame 180 is illustrated in FIG. 30. It includes C-shaped arms 182 that support male elements on their inner surfaces. The male elements on the arms 182 oppose a third male element 184 mounted on the surface 186 of the frame 180. It will be appreciated that the male elements on the arms 182 will contact the corresponding recesses 174, 176, and the third male element will contact the flat surface 178, to define three pairs of aligning elements. The male elements received in the recesses 174 and 176 can have a concave surface as described above with respect to FIGS. 20 to 25 or can simply comprise portions of spherical balls if the stresses will allow such small contact surfaces. The male element supported by the flat surface 178 has a convex contact surface which can be a spherical surface. It will be appreciated that the aligning pair defined by the flat surface 178 and its male element cannot be secured by a centrally extending bolt as described for the aligning pair of FIG. 22. Instead, this aligning pair is held in place by connecting bolts (not shown) associated with the other two aligning pairs. The aligning elements are made of a hardened material such that when the plate 172 is placed in the frame 180, it is capable of supporting the movement about the X-axis caused by the overhanging weight in the Y-direction. Once again six unique points of contact are established: the tetrahedral depression 176 having three points of contact, the groove 174 having two points of contact, and the flat depression 178 forming one point of contact. As mentioned above, only the two pairs of aligning elements corresponding to the depressions 174, 176 and their male elements are secured by means of bolts (not shown). The bolts pass centrally through the two aligning element pairs in a manner similar to that described with respect to the FIG. 22 embodiment.

Once the system has been laid out using mathematical modeling the manufacturing stage is implemented by carefully positioning the male and female elements constituting the kinematic coupling for each module. This is the only time that careful calibration should be required, since the use of substantially rigid frames in conjunction with kinematic coupling should not require recalibration during the assembly stage. During the manufacturing stage, one set of elements is initially mounted on one of the structures. For instance, a set of male elements can be mounted on the frame in a manner illustrated in FIG. 22. A master tooling plate is then used to position the contact elements. FIG. 31 illustrates a master tooling plate 190. The plate 190 is provided with three male elements 192 corresponding exactly to the male elements on the frame. Using the plate 100 as a dimensional location reference, corresponding contact elements 194 can be accurately mounted in the opposing surface of the module 196 as illustrated in FIG. 32. It will be appreciated that future replacement of modules can be effected in a similar manner. When the module is transferred to the support frame the complimentary locating elements repeatedly precisely align the module without the need to recalibrate. Thus installation and future servicing or replacement of modules becomes a simple mechanical task, not requiring any skill or recalibration.

It will be appreciated that the design and manufacturing techniques described above are applicable to any modular system and are not limited to a silicon wafer handling system. Clearly, the precise configuration of the kinematic couplings can be changed to meet the specific load requirements.

We claim:

1. A modular system comprising:

a substantially rigid frame; and a plurality of modules each of which is mounted at a predetermined location of the frame by means of a kinematic coupling between the frame and the module, the frame forming a common substrate for the modules, thereby defining a global set of reference axes standing in a predetermined relationship to reference axes associated with each of the modules;

wherein each kinematic coupling includes three aligning element pairs comprising three male elements, and three contact elements opposing the male elements, the contact elements defining six contact surfaces to establish six points of contact between the male elements and the contact elements, and securing means located in proximity to at least two of the aligning element pairs for securing the module to the frame, the securing means being located sufficiently closely to their respective aligning element pairs to continually maintain six points of contact between the three male elements and their contact elements, each securing means comprising a bolt extending between a male element and its contact element.

2. A modular system of claim 1, wherein at least one of the modules comprises a support fixedly secured to the frame, and a moveable member, movably connected to the support.

3. A modular system of claim 1 wherein the modular system is a photoresist processing system for treating silicon wafers.

4. A modular system comprising:

a substantially rigid frame; and a plurality of modules each of which is mounted at a predetermined location of the frame by means of a kinematic coupling between the frame and the module, the frame forming a common substrate for the modules thereby defining a global set of reference axes standing in a predetermined relationship to reference axes associated with each of the modules;

wherein each kinematic coupling includes three aligning element pairs comprising three male elements, and three contact elements opposing the male elements, the contact elements defining six contact surfaces to establish six points of contact between the male elements and the contact elements, wherein the contact elements include orienting features and the frame or module on which each contact element is mounted includes a reference feature for aligning the orienting feature relative to the reference feature, wherein the orienting feature comprises a spigot having a polygonal cross section, and the reference feature comprises a complementary recess for the spigot.

5. A modular system comprising a substantially rigid frame comprising at least one main beam and a plurality of bulkheads extending traversely to the main beam; and a plurality of modules each of which is mounted at a predetermined location of the frame by means of a kinematic coupling between the frame and the module, the frame forming a common substrate for the modules thereby defining a global set of reference axes standing in a predetermined relationship to reference axes associated with each of the modules;

wherein the at least one main beam comprises a tube containing at least one conduit.

6. A modular system comprising a substantially rigid frame comprising at least one main beam and a plurality of bulkheads extending traversely to the main beam; and a plurality of modules each of which is mounted at a predetermined location of the frame by means of a kinematic coupling between the frame and the module, the frame forming a common substrate for the modules thereby defining a global set of reference axes standing in a predetermined relationship to reference axes associated with each of the modules;

wherein the at least one main beam comprises a tube means for conveying at least one of electricity and fluid.

7. A modular system comprising a substantially rigid frame comprising at least one main beam and a plurality of bulkheads extending traversely to the main beam; and a plurality of modules each of which is mounted at a predetermined location of the frame by means of a kinematic coupling between the frame and the module, the frame forming a common substrate for the modules thereby defining a global set of reference axes standing in a predetermined relationship to reference axes associated with each of the modules;

wherein the at least one main beam comprises a tubular structure, the tubular structure including an outer tube and at least one inner tube.

8. A modular system of claim 7, where the main beam is an I-beam having a central web, and wherein the bulkheads extend under the regions where the modules are located.

9. A modular system of claim 8, wherein the central web of the I-beam, and the bulkheads define holes extending through them.

10. A modular system of claim 7 wherein the outer tube is separated from the at least one inner tube by a damping medium.

* * * * *